(12) United States Patent
Wristers et al.

(10) Patent No.: US 6,552,776 B1
(45) Date of Patent: *Apr. 22, 2003

(54) PHOTOLITHOGRAPHIC SYSTEM INCLUDING LIGHT FILTER THAT COMPENSATES FOR LENS ERROR

(75) Inventors: Derick J. Wristers, Austin, TX (US); Robert Dawson, Austin, TX (US); H. Jim Fulford, Jr., Austin, TX (US); Mark I. Gardner, Cedar Creek, TX (US); Frederick N. Hause, Austin, TX (US); Bradley T. Moore, Austin, TX (US); Mark W. Michael, Cedar Park, TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/183,176

(22) Filed: Oct. 30, 1998

(51) Int. Cl.$^7$ .......................... G03B 27/54; G03B 27/72
(52) U.S. Cl. .......................................... 355/67; 355/71
(58) Field of Search ............................. 355/35, 52, 53, 355/67, 71, 55, 18, 77, 38; 430/30

(56) References Cited

U.S. PATENT DOCUMENTS

| | | | | |
|---|---|---|---|---|
| 4,239,385 A | * | 12/1980 | Hujer | 355/71 |
| 4,585,342 A | | 4/1986 | Lin et al. | 356/124 |
| 4,621,371 A | * | 11/1986 | Gotou et al. | 378/34 |
| 4,759,626 A | | 7/1988 | Kroko | 356/124 |
| 4,794,426 A | | 12/1988 | Nishi | 355/434 |
| 5,288,572 A | | 2/1994 | Giapis et al. | 430/30 |
| 5,308,991 A | | 5/1994 | Kaplan | 250/492.22 |
| 5,309,197 A | | 5/1994 | Mori et al. | 355/53 |
| 5,329,334 A | | 7/1994 | Yim et al. | 355/53 |
| 5,396,311 A | | 3/1995 | Fukushima et al. | 355/71 |
| 5,402,224 A | | 3/1995 | Hirukawa et al. | 356/124 |
| 5,451,479 A | | 9/1995 | Ishibashi | 430/322 |
| 5,508,803 A | | 4/1996 | Hibbs et al. | 356/243 |
| 5,572,288 A | | 11/1996 | Mizutani | 355/53 |
| 5,723,238 A | | 3/1998 | Moore et al. | 430/30 |
| 5,914,202 A | * | 6/1999 | Nguyen et al. | 430/5 |
| 6,262,795 B1 | * | 7/2001 | Baker et al. | 355/53 |

* cited by examiner

Primary Examiner—Rodney Fuller

(57) ABSTRACT

A photolithographic system including a light filter that varies light intensity according to measured dimensional data that characterizes a lens error is disclosed. The light filter compensates for the lens error by reducing the light intensity of the image pattern as the lens error increases. In this manner, when the lens error causes focusing variations that result in enlarged portions of the image pattern, the light filter reduces the light intensity transmitted to the enlarged portions of the image pattern. This, in turn, reduces the rate in which regions of the photoresist layer beneath the enlarged portions of the image pattern are rendered soluble to a subsequent developer. As a result, after the photoresist layer is developed, linewidth variations that otherwise result from the lens error are reduced due to the light filter. Preferably, the light filter includes a light-absorbing film such as a semi-transparent layer such as calcium fluoride on a light-transmitting base such as a quartz plate, and the thickness of the light-absorbing film varies in accordance with the measured dimensional data to provide the desired variations in light intensity. The invention is particularly well-suited for patterning a photoresist layer that defines polysilicon gates of an integrated circuit device.

18 Claims, 5 Drawing Sheets

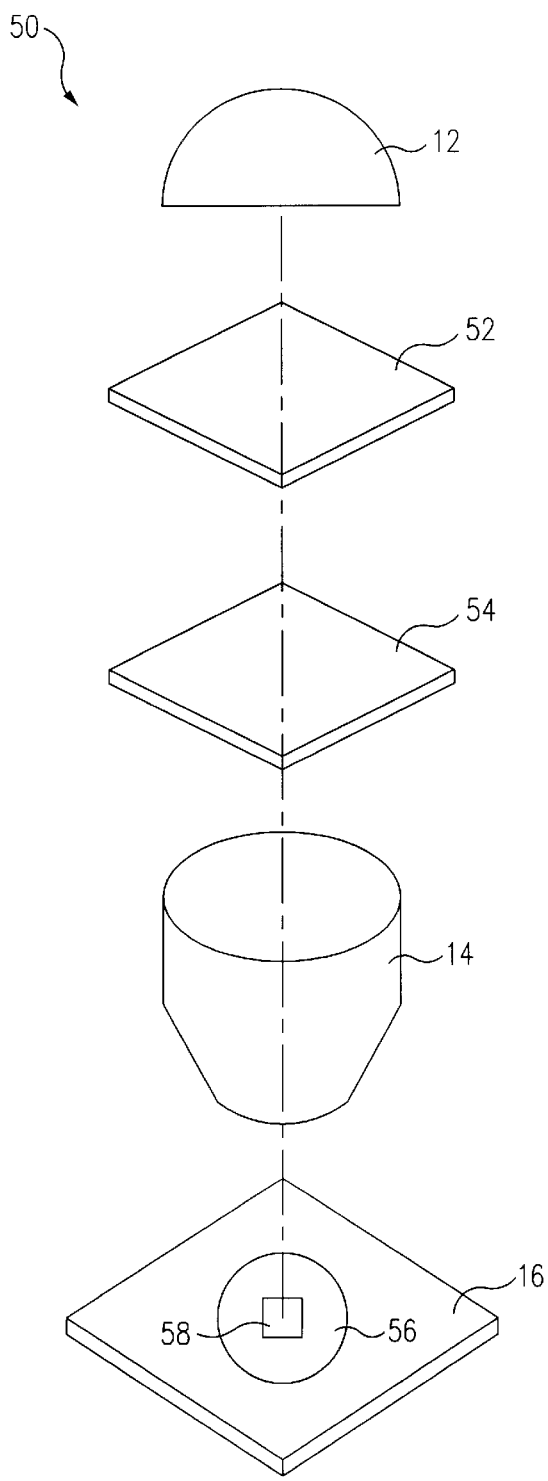
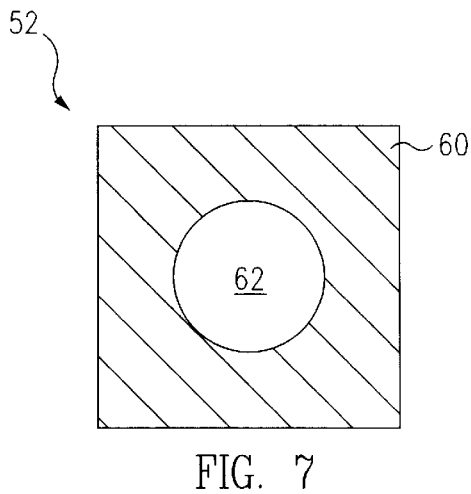
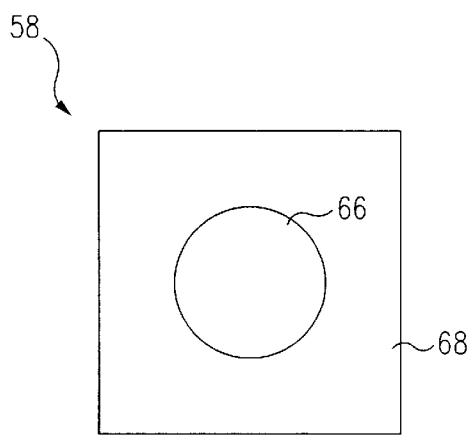
FIG. 6
FIG. 7
FIG. 8

PHOTOLITHOGRAPHIC SYSTEM INCLUDING LIGHT FILTER THAT COMPENSATES FOR LENS ERROR

BACKGROUND OF THE INVENTION

1. Field of the Invention

The present invention relates to photolithographic systems used for fabricating integrated circuit devices, and more particularly, to photolithographic systems that compensate for lens errors.

2. Description of the Related Art

An insulated-gate field-effect transistor (IGFET), such as a metal-oxide semiconductor field-effect transistor (MOSFET), uses a gate to control an underlying surface channel joining a source and a drain. The channel, source, and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, that sets up a transverse electric field in order to modulate the longitudinal conductance of the channel.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide the gate. Thereafter, the gate provides an implant mask during the implantation of source and drain regions, and the implanted dopants are driven-in and activated using a high-temperature anneal that would otherwise melt the aluminum. This self-aligning procedure tends to improve packing density and reduce parasitic overlap capacitances between the gate and the source and drain. As such, the gate length (or "critical dimension") has a major influence on the channel length.

The performance of an integrated circuit depends not only on the value of the channel lengths, but also upon the uniformity of the channel lengths. In an integrated circuit having some devices with relatively longer channel lengths and other devices with relatively shorter channel lengths, the devices with shorter channel lengths have a higher drain current than the devices with the longer channel lengths. The difference in drain currents can cause problems. For instance, devices with too large a drain current may have a high lateral electric field that causes significant hot carrier effects despite the presence of a lightly doped drain (LDD), whereas devices with too small a drain current may have unacceptably slow switching speeds. Therefore, accurate gate lengths can be extremely important to achieving the required device performance and reliability.

Photolithography is frequently used to create patterns that define where a polysilicon layer is etched to form the gates. Typically, the wafer is cleaned and prebaked to drive off moisture and promote adhesion. An adhesion promoter is deposited on the wafer and a few milliliters of positive photoresist are deposited onto the spinning wafer to provide a uniform layer. The photoresist is soft baked to drive off excess solvents. The photoresist is irradiated with an image pattern that renders selected portions of the photoresist soluble. A developer removes the soluble portions of the photoresist and an optional de-scum removes very small quantities of photoresist in unwanted areas. The photoresist is hard baked to remove residual solvents and improve adhesion and etch resistance. The etch is applied using the photoresist as an etch mask, and the photoresist is stripped. Therefore, the photoresist has the primary functions of replicating the image pattern and protecting the underlying polysilicon when etching occurs.

Photolithographic systems typically use a light source and a lens in conjunction with a mask or reticle to selectively irradiate the photoresist. The light source projects light through the mask or reticle to the lens, and the lens focuses an image of the mask or reticle onto the wafer. A mask transfers a pattern onto the entire wafer (or another mask) in a single exposure step, whereas a reticle transfers a pattern onto only a portion of the wafer. Step and repeat systems transfer multiple images of the reticle pattern over the entire wafer using multiple exposures. The reticle pattern is typically 2× to 10× the size of the image on the wafer, due to reduction by the lens. However, non-reduction (1×) steppers offer a larger field, thereby allowing more than one pattern to be printed at each exposure.

Photolithographic systems often use a mercury-vapor lamp as the illumination source. In mercury-vapor lamps, a discharge arc of high-pressure mercury vapor emits a characteristic spectrum that contains several sharp lines in the ultraviolet region—the I-line (365 nm), the H-line (405 nm) and the G-line (436 nm). Photolithographic systems are designed, for instance, to operate using the G-line, the I-line, a combination of the lines, or at deep ultraviolet light (240 nm). To obtain the proper projection, high power mercury-vapor lamps are used that draw 200 to 1000 watts and provide ultraviolet intensity on the order of 100 milliwatts/$cm^2$. In some systems, air jets cool the lamp, and the heated air is removed by an exhaust fan.

The reticle typically includes a chrome pattern on a quartz plate. The chrome pattern has sufficient thickness to completely block ultraviolet light, whereas the quartz has a high transmission of ultraviolet light. Although quartz tends to be expensive, it has become more affordable with the development of high quality synthetic quartz material.

Lens errors in step and repeat systems are highly undesirable since they disrupt the pattern transfer from the reticle to the photoresist, which in turn introduces flaws into the integrated circuit manufacturing process. Lens errors include a variety of optical aberrations, such as astigmatism and distortion. Astigmatism arises when the lens curvature is irregular. Distortion arises when the lens magnification varies with radial distance from the lens center. For instance, with positive or pincushion distortion, each image point is displaced radially outward from the center and the most distant image points are displaced outward the most. With negative or barrel distortion, each image point is displaced radially inward toward the center and the most distant image points are displaced inward the most.

Replacing the lens in a step and repeat system is considered impractical since the lens is a large, heavy, integral part of the system, and is usually extremely expensive. Furthermore, it is unlikely that a substitute lens will render subsequent corrections unnecessary. Accordingly, the lens error can be measured so that corrections or compensations can be made.

A conventional technique for evaluating lens errors includes performing a photoresist exposure and development using specially designed mask patterns to be used for evaluation purposes. After such an imaging process, the wafer is either subjected to an optical inspection or is further processed to form electrically measurable patterns. The use of photosensitive detectors fabricated on silicon to monitor optical systems is also known in the art. For instance, U.S. Pat. No. 4,585,342 discloses a silicon wafer with light sensitive detectors arranged in a matrix, an x-y stage for positioning the wafer so that each one of the detectors is separately disposed in sequence in the same location in the field of projected light, and a computer for recording the output signals of the detectors in order to calibrate the detectors prior to evaluating the performance of an optical lithographic system.

After the lens error is measured, some form of corrective measure is typically employed. For instance, U.S. Pat. No. 5,308,991 describes predistorted reticles that incorporate compensating corrections for known lens distortions. Lens distortion data is obtained which represents the feature displacement on a wafer as a function of the field position of the lens. The lens distortion data is used to calculate x and y dimensional correction terms. The inverted correction terms are multiplied by a stage controller's compensation value to correctly position the reticle. In this manner, the reticle is positioned to compensate for the lens error. A drawback to this approach, however, is that a highly accurate reticle positioning apparatus is required. Furthermore, although feature location can be adjusted, it is difficult to adjust the feature size.

The stepper focus setting corresponds to the adjustable distance between the wafer surface and the reticle/lens. Unfortunately, the lens error creates focusing variations, and it becomes difficult or impossible to properly focus the entire exposure field. "Best focus" is the focus setting that provides the best resolution and linewidth control. Best focus usually optimizes the focus near the center of the exposure field, but in doing so, often creates a substantial focusing error near the periphery of the exposure field. The focusing error tends to expand the image pattern, which can decrease the photoresist linewidth, leading to decreased gate lengths and corresponding variations in channel lengths and drain currents.

While optical photolithography continues to be the dominant technology because it is well established and is capable of implementing sub-micron resolution at least as low as 0.35 microns using current equipment, as feature sizes approach 0.5 microns and below, and these features extend across wafer areas of a square inch and more, extensive efforts are being directed at developing alternative technologies. Electron-beam, ion-beam, and x-ray technologies have demonstrated patterning capabilities that extend beyond the limits of optical systems. Electron-beams and ion-beams can also directly write image patterns onto the photoresist without the use of a mask or reticle, for instance by using a controlled stage to position the wafer beneath the tool. However, these alternative approaches have drawbacks. For instance, electron-beam lithography has low throughput, x-ray lithography has difficulties with fabricating suitable masks, and ion-beam lithography has low throughput and difficulties with obtaining reliable ion sources.

Thus, workers in the art recognize that there are obvious incentives for trying to push the currently dominant technology (optical photolithography) into the fine-line region. Such an effort, if successful, has the potential for retrofitting or modifying expensive equipment to give it significantly better patterning capabilities.

Accordingly, a need exists for improvements in photolithography that facilitate forming fine-line patterns, that are well-suited for optical photolithographic systems that pattern integrated circuit devices, and that compensate for lens errors. One desirable feature of an improved photolithography would be the reduction of the effects of lens errors in photolithographic systems such as step and repeat systems during the fabrication of integrated circuit devices. Another desirable feature of an improved photolithography would be a convenient technique for upgrading existing photolithographic systems.

SUMMARY OF THE INVENTION

The foregoing and other features are accomplished, according to the present invention, by using a specially designed light filter in a photolithographic system. The light filter varies the light intensity according to measured dimensional data that characterizes the lens error.

In accordance with one aspect of the invention, a method of compensating for a lens error of a lens in a photolithographic system includes characterizing the lens error in terms of measured dimensional data as a function of x and y coordinates on an exposure field associated with the lens, providing a light filter designed to vary light intensity in accordance with the measured dimensional data, and projecting light through the light filter, a reticle and the lens to form an image pattern on a positive photoresist layer during the fabrication of an integrated circuit device. The light filter compensates for the lens error by reducing the light intensity of the image pattern as the lens error increases.

In this manner, when the lens error causes focusing variations that result in enlarged portions of the image pattern, the light filter reduces the light intensity transmitted to the enlarged portions of the image pattern. This, in turn, reduces the rate in which regions of the photoresist layer beneath the enlarged portions of the image pattern are rendered soluble to a subsequent developer. As a result, after the photoresist layer is developed, linewidth variations that would otherwise result from the lens error are reduced due to the light filter.

The invention is particularly well-suited for patterning a photoresist layer that defines polysilicon gates for an integrated circuit device. The light filter compensates for the lens error, thereby reducing linewidth variations in the photoresist, reducing variations in the gate lengths, and ultimately reducing variations in channel lengths and drive currents. Of course, the invention is well-suited for patterning photoresist layers that define other circuit elements, particularly where highly accurate pattern transfer is necessary.

Preferably, the light filter includes a light-absorbing film on a light-transmitting base, and the thickness of the light-absorbing film varies in accordance with the measured dimensional data. That is, variations in the thickness of the light-absorbing film are responsible for variations in the light intensity of the image pattern. It is also preferred that the thickness of the light-absorbing film is determined by deriving light intensity data from the measured dimensional data using a curve obtained by previous measurements of patterns fabricated by the photolithographic system, and deriving thickness data from the light intensity data using Lambert's law of absorption. As exemplary materials, the light-absorbing material is a semi-transparent layer such as calcium fluoride, and the light-transmitting base is a quartz plate.

In accordance with another aspect of the invention, obtaining the measured dimensional data includes projecting light through a test pattern and the lens to provide a first image pattern on a first photoresist layer, developing the first photoresist layer to form openings therethrough that correspond to the first image pattern such that the first photoresist layer defines a transfer pattern, and measuring the transfer pattern. The first photoresist layer can be measured directly. Alternatively, the method may include etching a test material through the openings in the first photoresist layer using the first photoresist layer as an etch mask to remove selected portions of the test material, thereby forming test segments from unetched portions of the test material, stripping the first photoresist layer, and measuring the test segments.

Advantageously, the light filter can be installed in conventional photolithographic systems, thereby providing a relatively convenient and inexpensive technique for improving the patterning capability of existing photolithographic systems.

These and other features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which:

FIG. 6 is a schematic illustration showing a step and repeat system in accordance with an embodiment of the invention;

FIG. 7 is an enlarged plan view showing the light filter in FIG. 6;

FIG. 8 is an enlarged plan view showing focused and unfocused regions of the exposure field in FIG. 6.

DETAILED DESCRIPTION OF THE PREFERRED EMBODIMENTS

Figure 1:
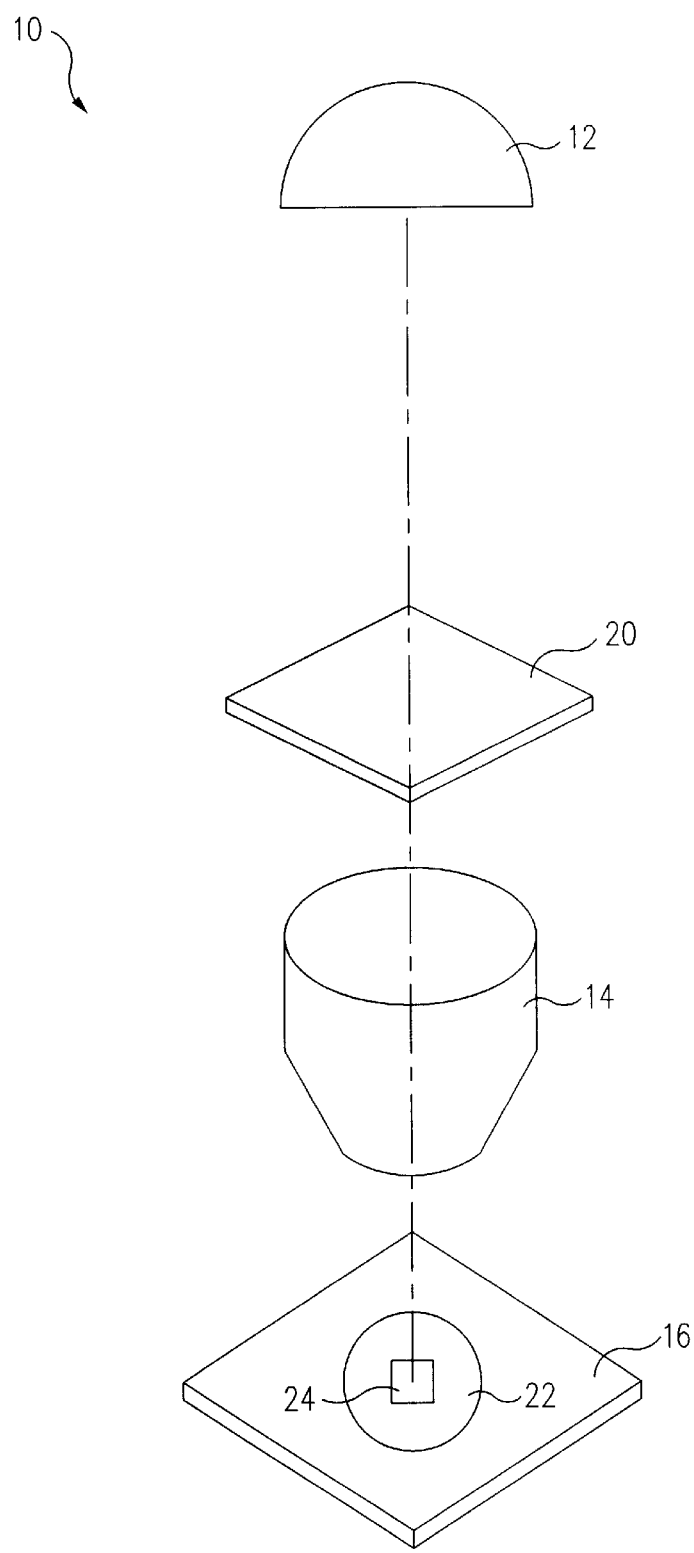
FIG. 1 is a schematic illustration showing a conventional step and repeat system.

In the drawings, depicted elements are not necessarily drawn to scale and like or similar elements may be designated by the same reference numeral throughout the several views.

FIG. 1 is a schematic illustration showing a conventional photolithographic step and repeat system for fabricating integrated circuit devices. System 10 includes light source 12, lens 14, and x-y stepping table 16. Other optical elements such as mirrors, condenser lenses, aperture blades, and light filters (that limit exposure wavelengths to specified frequencies and bandwidth), as found in conventional photolithographic systems, are not shown. Reticle 20 and photoresist-coated wafer 22 are used with system 10. Reticle 20 is positioned between light source. 12 and lens 14, and wafer 22 is 10 removably secured to stepping table 16.

Light source 12 includes a mercury-vapor'lamp for generating deep ultraviolet light. Reticle 20 includes a light-blocking chrome pattern on a light-transmitting quartz plate. The chrome pattern defines an image pattern. That is, the chrome pattern blocks the light, and light transmitted through optically transparent lines of the quartz plate outside the chrome pattern provides the image pattern. Furthermore, reticle 20 is a test reticle that provides the image pattern as a uniform, repeating pattern. Lens 14 projects exposure field 24, which contains the image pattern, onto wafer 22. A computer (not shown), which is a standard digital data processor, controls the motion of stepping table 16 in the x-y direction for step and repeat operation, and the motion of lens 14 in the z direction for focusing the image pattern. Mechanisms to move the reticle, lens, and wafer in the x, y or z directions in response to electrical control signals are well-known in the art.

Figure 2:
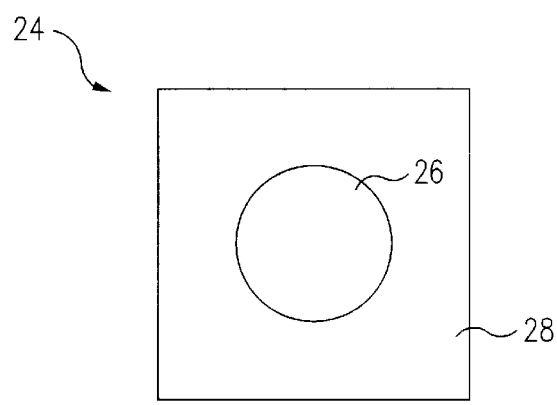
FIG. 2 is an enlarged plan view showing focused and unfocused regions of the exposure field in FIG. 1.

FIG. 2 is an enlarged plan view showing exposure field 24. As is seen, exposure field 24 includes focused region 26 surrounded by unfocused region 28. Focused region 26 occupies a central portion of exposure field 24, and unfocused region 28 is located between focused region 26 and the outer periphery of exposure field 24. Exposure field 24 contains the image pattern (not shown) defined by reticle 20. The portions of the image pattern within focused region 26 accurately represent the corresponding portions of the optically transparent lines of reticle 20. However, the portions of the image pattern within unfocused region 28 are somewhat larger than they should be due to focusing problems. That is, as exposure field 24 becomes less focused, the image pattern becomes enlarged and extends into regions of exposure field 24 that are not intended to be irradiated. Regardless of the focusing variations, all portions of the image pattern in exposure field 24 have essentially identical light intensities.

Exposure field 24 is obtained using the best focus for lens 14. Unfortunately, lens 14 includes structural defects that contribute to a lens error that prevents focusing the entire exposure field 24. If lens 14 is moved from its current position in the z direction with respect to wafer 22, then the overall focus of exposure field 24 will get worse, regardless of whether lens 14 is moved towards or away from wafer 22.

It is known that the larger the exposure field, the more area of the lens will be used, and thus the greater likelihood that areas of the lens having significant deviations from the ideal flat focus characteristics will be used for patterning critical circuit features such as polysilicon gates. However, the larger the exposure field, the larger the through-put of wafers in production. Therefore, it is highly desirable to compensate for the lens error so that critical features can be accurately patterned across larger regions of the exposure field.

In accordance with the present invention, it becomes necessary to characterize the lens error in some manner so that a light filter can be constructed which compensates for the lens error during the fabrication of an integrated circuit device.

Figure 3:
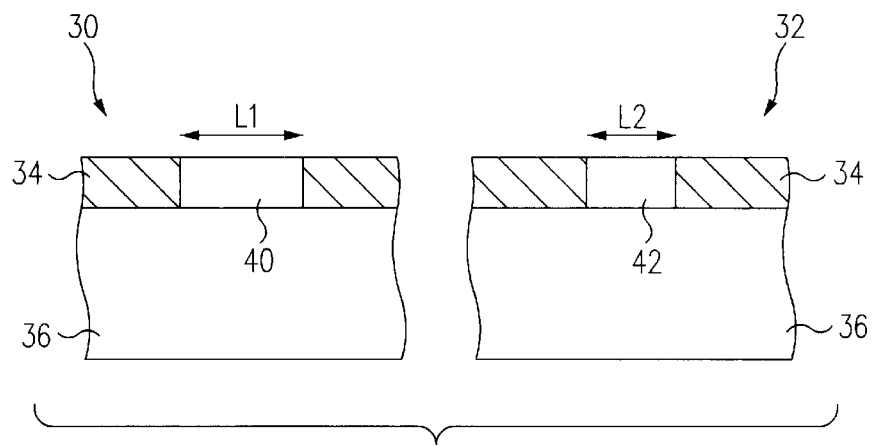
FIGS. 3–4 are enlarged cross-sectional views showing successive processing steps for measuring the lens error of the lens in FIG. 1.

FIG. 3 is an enlarged cross-sectional view showing portions of wafer 22 beneath exposure field 24. Wafer portion 30 of wafer 22 is beneath focused region 26, and wafer portion 32 of wafer 22 is beneath unfocused region 28. Wafer 22 includes positive photoresist layer 34 on silicon substrate 36. Photoresist layer 34 has a uniform thickness and planar top surface. The regions of photoresist layer 34 in wafer portions 30 and 32 that the image pattern renders soluble to a subsequent developer are shown by the cross-hatched diagonal lines. Other regions of photoresist layer 34, which remain unirradiated and insoluble to the subsequent developer, include photoresist segment 40 in wafer portion 30 and photoresist segment 42 in wafer portion 32. Photoresist segment 40 has a linewidth L1 of approximately 3500 angstroms, and photoresist segment 42 has a linewidth L2 of approximately 3000 angstroms. Of importance, the portions of the chrome pattern on reticle 20 that define photoresist segments 40 and 42 have essentially identical linewidths. Nevertheless, photoresist segment 42 has linewidth L2 instead of linewidth L1 due to the enlargement of the image pattern in unfocused region 28, which is attributable to the lens error of lens 14.

Figure 4:
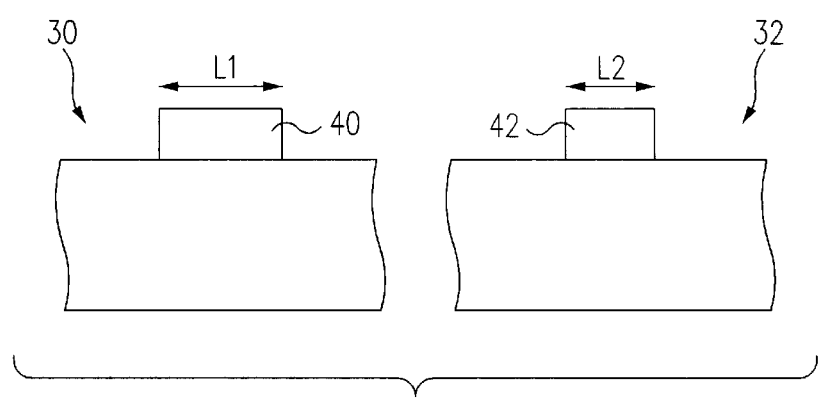

FIG. 4 is an enlarged cross-sectional view showing wafer portions 30 and 32 after the exposure step is completed, a developer removes the regions of photoresist layer 34 rendered soluble by the image pattern, and photoresist 34 is subjected to a hard bake. The developer concentration, developer temperature and developer agitation method should be optimized so that the developer causes minimal pattern disruption. After development and hard baking occur, photoresist segment 40 continues to have linewidth L1 and photoresist segment 42 continues to have linewidth L2.

Photoresist segments 40 and 42, along with many other photoresist segments of photoresist layer 34 that are patterned using the previous exposure step, are now measured in order to characterize the lens error for lens 14. The photoresist segments provide a transfer pattern based on the chrome pattern on reticle 20. Since this chrome pattern is a uniform, repeating pattern, and photoresist layer has a uniform thickness and planar top surface, most or all variations in the linewidths of the photoresist segments can be attributed to the lens error of lens 14.

The photoresist segments are measured using a high resolution system such as a laser scanner or a scanning electron microscope (SEM). Although ordinary microscopes continue to find wide applicability because of their low cost, ease of use, and high throughput, they are generally not suitable for measuring submicron geometries. A laser scanner utilizes a He—Ne laser focused to a 1 micron spot, which is scanned across the line to be measured. The reflected light can be detected with various instruments, including a pair of photodetectors positioned on either side of the scan axis, a confocal scanned microscope, or a high resolution laser interferometer. A SEM creates a beam of electrons with an energy on the order to 0.5 to 100 kiloelectron-volts, focused to a small diameter, and directed at a surface in a raster-scan pattern The electrons striking the surface cause the emission of secondary electrons, which are collected by a detector, and their flux determines the intensity of the image.

Preferably, the lens error characterized in terms of measured dimensional data which provides the measured linewidths as a function of position on the exposure field (or lens surface through which the light passes). It is also preferred that the position of the exposure field be defined as (x,y) coordinates, although alternatively, the position can be defined as a radial distance from the center of the exposure field. For instance, the measured dimension for the (x,y) coordinates corresponding to photoresist segment 40 is 3500 angstroms, which is the largest measured linewidth, and the measured dimension for the (x,y) coordinates corresponding to photoresist segment 42 is 3000 angstroms.

The measured dimensional data can be interpolated or extrapolated as necessary, and as a first approximation, one may assume a linear variation in lens error. Furthermore, multiple transfer patterns can be measured on different photoresist layers, and these measurements can be evaluated using statistical analysis to determine the lens error. Statistical analysis may also be useful in evaluating the effects of residual heating (from previous exposures) on the lens error. That is, since step and repeat exposures are often done rapidly, previous exposures may affect the lens heating and the lens error. Statistical analysis for multiple exposures can be used, for instance, to provide measured dimensional data based on the lens heating from typical exposures, although the initial exposures may produce somewhat less lens heating.

If desired, the measured dimensional data can be determined in conjunction with a focus-exposure matrix. For instance, once the focus-exposure matrix for a wafer is obtained, the exposure step for characterizing the lens error can be performed using the optimal focus and exposure parameters. Furthermore, the measured dimensional data may include corrective information not only about inherent lens errors, but also about lens heating errors, variations in the photoresist, variations in the topography of the wafer, and other factors that contribute to linewidth variations.

Once the measured dimensional data is obtained, it becomes necessary to identify the desired light intensities (or exposure gradients) from the measured dimensional data for each of the (x,y) coordinates.

Figure 5:
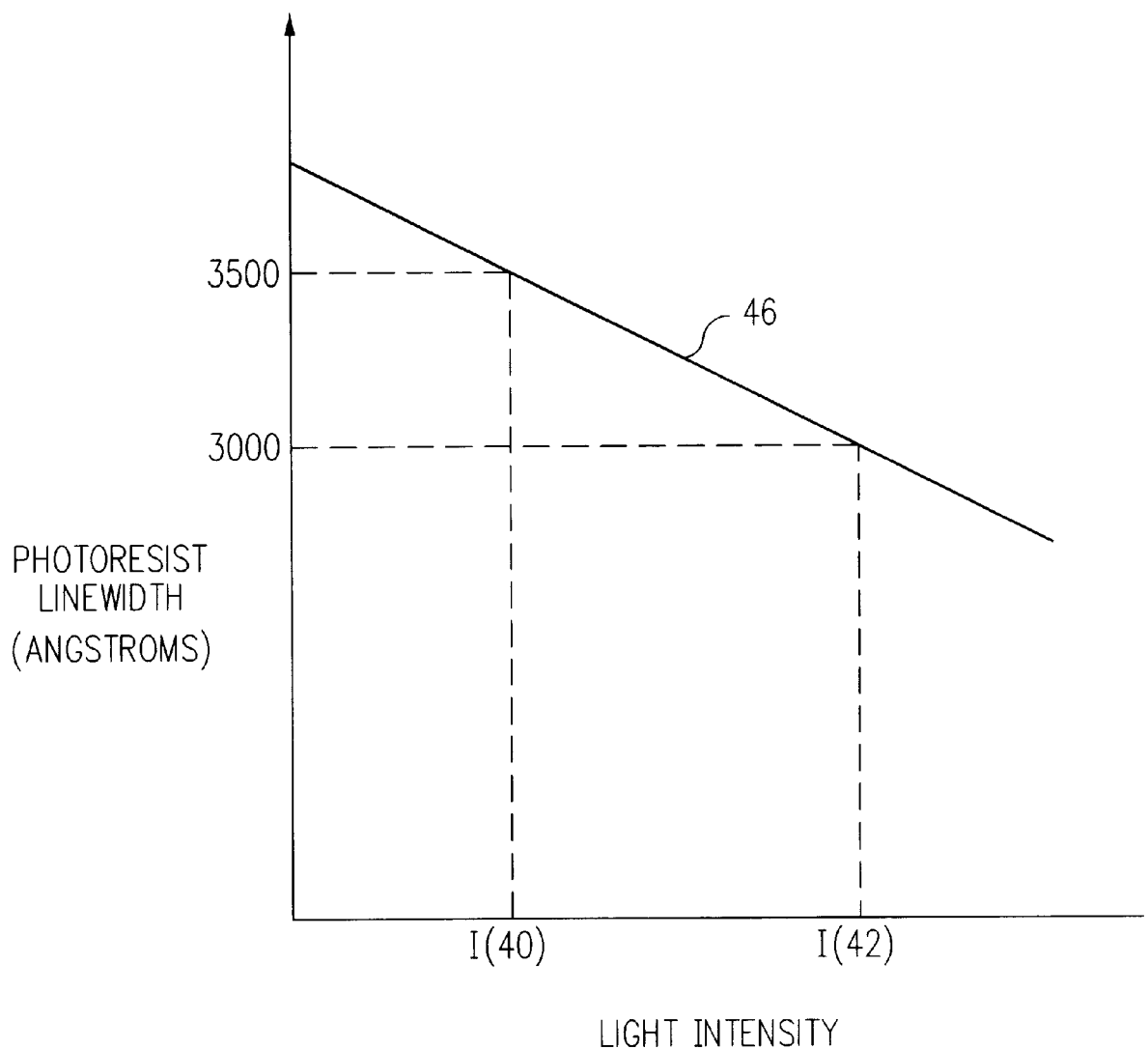
FIG. 5 is a curve of light intensity versus photoresist linewidth for the system in FIG. 1.

FIG. 5 shows a curve of light intensity versus photoresist linewidth Curve 46 is specific to system 10 as well as the particular photoresist composition, photoresist thickness and planarity, development, soft and hard bake, exposure time, exposure wavelength, exposure coherence, and focus setting that were used to form photoresist segments 40 and 42, and that shall be used during the subsequent fabrication of an integrated circuit device. Curve 46 is obtained from previous measurements taken at a single point in exposure field 24 to avoid variations caused by lens 14. In fact, curve 46 may be obtained from the focus-exposure matrix mentioned above, using the photoresist linewidths and light intensities that occur at the best focus. Curve 46 indicates that, under appropriate conditions, a substantially linear relationship exists between light intensity and photoresist linewidth Decreasing the energy that impinges upon the photoresist decreases the photochemical transformations in the photoresist that render it soluble to the developer. Since the energy impinging upon the photoresist is the product of light intensity and exposure time, decreasing the light intensity while keeping the exposure time constant serves to decrease the photochemical transformations, thereby decreasing the amount of photoresist rendered soluble to the developer, and increasing the photoresist linewidth.

Curve 46 is used to identify the light intensities needed to compensate for the lens error. For each of the (x,y) coordinates, the associated linewidth is mapped into a corresponding light intensity by visually examining curve 46. In this manner, light intensity data can be provided as a function of the (x,y) coordinates. For instance, the (x,y) coordinates corresponding to photoresist segment 40 have a measured linewidth of 3500 angstroms and therefore are assigned a light intensity of I(40), and the (x,y) coordinates corresponding to photoresist segment 42 have a measured linewidth of 3000 angstroms and therefore are assigned a light intensity of I(42).

Once the light intensity data is obtained, the next step is to construct a light filter that transmits the appropriate light intensity as a function of position on the exposure field. The light filter is designed in accordance with the light intensity data, and therefore, indirectly, in accordance with the measured dimensional data. The light filter is also designed to provide the desired light intensity at the same wavelength used to provide the measured dimensional data and curve 46.

The light filter shall be positioned between light source 12 and a reticle during a subsequent exposure step, and shall vary the light intensity of an image pattern, without changing the configuration or wavelength distribution of the image pattern, in order to compensate for the lens error. In this manner, the more that particular regions of the image pattern become enlarged due to the lens error, the less light intensity the light filter will transmit to the enlarged regions of the image pattern, thereby reducing the rate at which positive photoresist beneath the enlarged regions of the image pattern is rendered soluble to a subsequent developer, and reducing the linewidth variations in the photoresist that would otherwise be caused by the lens error.

Preferably, the light filter is constructed with a light-absorbing film on a light-transmitting base, and the thickness of the light-absorbing film is varied to provide the desired light intensities at the (x,y) coordinates.

Lambert's law of absorption can be used to calculate the appropriate thickness of the light-absorbing film at each of the (x,y) coordinates. Lambert's law of absorption is as follows:

$$I(z)=I(o)\exp(-\alpha z) \quad (1)$$

where z is the thickness of the material, I(z) is the light intensity that passes through thickness z of the material, I(o) is the light intensity that impinges upon the material, and α is the optical absorption coefficient for the material at the particular wavelength of the light. Thus, the light intensity transmitted by the material changes as a function of distance that the light travels through the material. Expression (1) can be solved for thickness as follows:

$$z=-(1/\alpha)*\ln[I(z)/I(o)] \quad (2)$$

Expression (2) indicates that the thickness of the material can be calculated to provide a predetermined light intensity. If a reduction lens is used, as is typical, then light intensity coming into the lens is proportional to the light intensity coming out of the lens divided by the square of the reduction. For example, if a 5× reduction lens is used, then light intensity coming into the lens is about 1/25 that of the light intensity coming out of the lens. Therefore, for each of the (x,y) coordinates, the appropriate thickness for the light-absorbing film can be calculated using the light intensity data and the lens reduction in conjunction with expression (2). In this manner, thickness data for the light-absorbing film is now provided for each of the (x,y) coordinates, and the light filter can be constructed.

For instance, the (x,y) coordinates corresponding to photoresist segment 40 have a light intensity of I(40) and therefore are assigned a thickness of $-(1/\alpha)*\ln[I(40)/I(40)]$, or zero, and the (x,y) coordinates corresponding to photoresist segment 42 have a light intensity of I(42) and therefore are assigned a thickness of $-1/\alpha)*\ln[I(42)/I(40)]$.

Preferably, the light-absorbing film is a semi-transparent layer such as calcium fluoride ($CaF_2$), germanium, aluminum, or an aluminum alloy, and the light-transmitting base is a quartz plate. Many other crystalline salts have suitable light-absorbing parameters. The light-absorbing film should be selected for stability and for a thermal expansion coefficient close to the light-transmitting base (i.e., quartz). Similarly, thin metal films, can function as a light-absorbing film. Metal oxides have better thermal characteristics, but are difficult to deposit with low defect densities. In addition, polysilicon or silicon compounds may be effective light-absorbing materials. The light-absorbing film fabricated, for example, by depositing a light-absorbing film on the light-transmitting base. Patterning and etching procedures can then be used implement a film profile resulting in the desired light transmission characteristics for the filter. If the light-absorbing film is aluminum or an aluminum alloy, it may be necessary to cool the light filter to prevent the aluminum or aluminum alloy from melting.

FIG. 6 is a schematic illustration showing a photolithographic step and repeat system in accordance with an embodiment of the invention. System 50 is an upgraded version of system 10. That is, system 50 includes all the elements of system 10, including light source 12, lens 14, and stepping table 16. Moreover, system 50 includes light filter 52 constructed with a semi-transparent calcium fluoride layer on a quartz plate as described above. Light filter 52 is designed to vary the light intensity so as to reduce the lens error of lens 14. The semi-transparent calcium fluoride layer has a varying thickness designed to reduce the intensity of the light, generated by light source 12, that is transmitted therethrough, in proportion to the lens error as characterized by the measured dimensional data.

Reticle 54 and photoresist-coated wafer 56 are used in conjunction with system 50 during the manufacture of an integrated circuit device. Reticle 54 is positioned between light filter 52 and lens 14, and wafer 56 is removably secured to stepping table 16. Reticle 54 includes a light-blocking chrome pattern on a light-transmitting quartz plate. The chrome pattern on reticle 54 defines an image pattern for defining polysilicon gates on wafer 56. Lens 14 focuses exposure field 58, which contains the image pattern, onto wafer 56. The exposure time, exposure wavelength and focus setting for exposure field 58 are essentially identical to those used for exposure field 24. In fact, the only significant differences between exposure field 58 and exposure field 24 is that they contain different image patterns (due to differences between reticle 54 and reticle 20) and different light intensity distributions (due to light filter 52).

FIG. 7 is an enlarged plan view showing light filter 52, which includes semi-transparent calcium fluoride layer 60 mounted on quartz plate 62. As is seen, calcium fluoride layer 60 covers the outer portion of quartz plate 62, leaving the central portion of quartz plate 62 exposed. The exposed central portion of quartz plate 62 corresponds to focused region 26, and calcium fluoride layer 60 corresponds to unfocused region 28. During exposure, the light from light source 12 that impinges upon light filter 52 passes through the exposed central portion of quartz plate 62 with essentially no absorption, but also passes through calcium fluoride layer 60 (and the underlying region of quartz plate 62) with a substantial amount of absorption by calcium fluoride layer 60. Therefore, the light intensity transmitted by calcium fluoride layer 60 to reticle 54 is substantially less than the light intensity transmitted by the central exposed portion of quartz plate 62 to reticle 54.

FIG. 8 is an enlarged plan view showing exposure field 58, which includes focused region 66 surrounded by unfocused region 68. The dimensions and focus of focused region 66 are essentially identical to those of focused region 26, and the dimensions and focus of unfocused region 68 are essentially identical to those of unfocused region 28. Thus, focused region 66 corresponds to the exposed central portion of quartz plate 62, and unfocused region 68 corresponds to calcium fluoride layer 60. In addition, the light intensity of focused region 66 is essentially identical to that of focused region 26 and unfocused region 28. The key difference, however, is that the light intensity of unfocused region 68 is substantially less than that of focused region 66 due to light filter 52. As a result, the portions of the image pattern within unfocused region 68 are somewhat larger than they should be due to focusing problems, but also, they have a reduced light intensity with respect to the non-enlarged portions of the image pattern within focused region 66.

Figure 9:
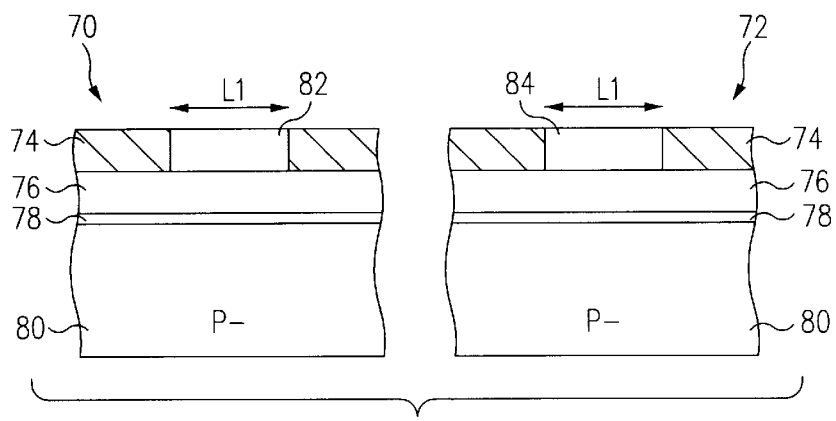
FIGS. 9–12 are enlarged cross-sectional views showing processing steps for fabricating semiconductor devices using the system in FIG. 6.

FIG. 9 is an enlarged cross-sectional view showing portions of wafer 56 beneath exposure field 58. Wafer portion 70 of wafer 56 is beneath focused region 60, and wafer portion 72 of wafer 56 is beneath unfocused region 68. Wafer 56 includes positive photoresist layer 74 on polysilicon layer 76, which is on gate oxide 78, which in turn is on silicon substrate 80. Polysilicon layer 76 has a thickness of about 2000 angstroms, and gate oxide 78 has a thickness of about 50 angstroms. Substrate 80, which is suitable for integrated circuit manufacture, has an epitaxial surface layer with a boron background concentration on the order of $1\times10^{15}$ atoms/cm$^3$, a <100> orientation and a resistivity of 12 ohm-cm. Photoresist layer 74 has essentially identical composition and thickness as photoresist layer 34, has been subjected to an essentially identical soft bake as that used for photoresist layer 34, and has a planar top surface.

The regions of photoresist layer 74 in wafer portions 70 and 72 that the image pattern renders soluble to a subsequent developer are shown by the cross-hatched diagonal lines. Other regions of photoresist layer 74, which remain insoluble to the subsequent developer, include photoresist segment 82 in wafer portion 70 and photoresist segment 84 in wafer portion 72. Photoresist segments 82 and 84 each have a linewidth L1 of approximately 3500 angstroms. The portions of the chrome pattern on reticle 54 that define photoresist segments 82 and 84 have essentially identical linewidths. Advantageously, although an enlarged portion of the image pattern impinges upon wafer portion 72, the enlargement is offset by a reduction in light intensity, due to light filter 52, as far as the amount of photoresist layer 74 rendered soluble to the developer. As a result, photoresist segment 84 is substantially unaffected by the enlargement of the image pattern. Likewise, a non-enlarged portion of the image pattern impinges upon wafer portion 70, but receives essentially no reduction in light intensity due to light filter 52.

Figure 10:
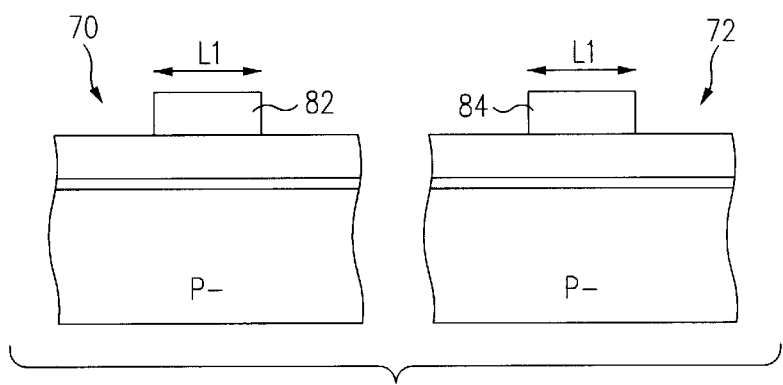

FIG. 10 is an enlarged cross-sectional view showing wafer portions 70 and 72 after the exposure step is completed, and a development step and hard bake are applied that are essentially identical to those used for photoresist layer 34. After development and hard baking occurs, photoresist segments 82 and 84 each continue to have linewidth L1.

Figure 11:
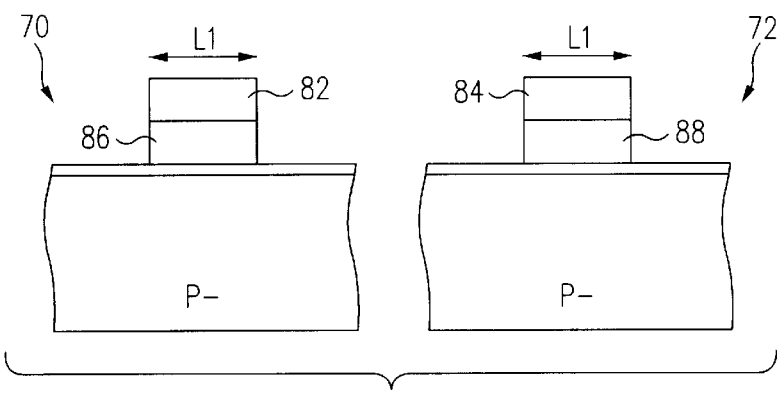

FIG. 11 is an enlarged cross-sectional view showing wafer portions 70 and 72 after a highly anisotropic dry etch is applied using photoresist segments 82 and 84, along with other photoresist segments on wafer 56, as an etch mask. The dry etch removes the exposed portions of polysilicon layer 76, and the portions of polysilicon layer 76 beneath the photoresist segments remain unetched. The dry etch is highly selective of polysilicon and non-selective of silicon dioxide so only a negligible amount of gate oxide 78 is removed and substrate 80 is unaffected. The unetched portion of polysilicon layer 76 over wafer portion 70 forms polysilicon gate 86, and the unetched portion of polysilicon layer 76 over wafer portion 72 forms polysilicon gate 88. Polysilicon gates 86 and 88 each include opposing vertical sidewalls separated by a linewidth or length, L1, of approximately 3500 angstroms.

Figure 12:
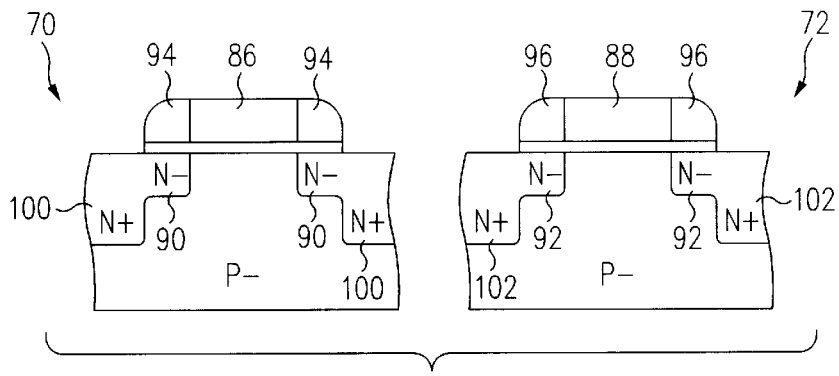

FIG. 12 is an enlarged cross-sectional view showing wafer portions 70 and 72 after further processing steps are performed. After photoresist segments 82 and 84 are stripped, lightly doped source/drain regions 90 and 92 are implanted into wafer portions 70 and 72, respectively, by subjecting the structure to ion implantation of arsenic, at a dose in the range of $1\times10^{13}$ to $5\times10^{18}$ atoms/cm$^2$ and an energy in the range of 2 to 80 kiloelectron-volts, using polysilicon gates 86 and 88 as implant masks. Lightly doped.source/drain regions 90 and 92 are self-aligned to the sidewalls of polysilicon gates 86 and 88, respectively, and are doped N- with an arsenic concentration in the range of about $1\times10^{17}$ to $1\times10^{18}$ atoms/cm$^3$. Thereafter, an oxide layer is conformally deposited over the exposed surfaces by plasma enhanced chemical vapor deposition, and the oxide layer is subjected to an anisotropic reactive ion etch that forms sidewall spacers 94 and 96 adjacent to the sidewalls of polysilicon gates 86 and 88, respectively. In a subsequent step, heavily doped source/drain regions 100 and 102 are implanted into wafer portions regions 70 and 72, respectively, by subjecting the structure to ion implantation of arsenic, at a dose in the range of $1\times10^{15}$ to $5\times10^{15}$ atoms/cm$^2$ and an energy m the range of 2 to 80 kiloelectron-volts, using polysilicon gates 86 and 88 and spacers 94 and 96 as an implant mask. Heavily doped source/drain regions 100 and 102 are self-aligned to the outside edges of spacers 94 and 96, respectively, and are doped N+ with an arsenic concentration in the range of about $1\times10^{18}$ to $1\times10^{20}$ atoms/cm$^3$. Thereafter, the structure is annealed to remove crystalline damage and to drive-in and activate the implanted dopants by applying a rapid thermal anneal on the order of 950 to 1050° C. for 10 to 30 seconds. Of importance, the channel lengths of the devices in wafer portions 70 and 72 are essentially identical due to compensation by light filter 52 for the lens error of lens 14.

Further processing steps in the fabrication of IGFETs typically include forming salicide contacts on the gates, sources and drains, forming a thick oxide layer over the regions, forming contact windows in the oxide layer to expose the salicide contacts, forming conductive plugs in the contact windows, forming various layers of interconnect metallization (such as metal-1 through metal-5), and forming a passivation layer over the metallization. In addition, earlier or subsequent high-temperature process steps can be used to supplement or replace the anneal step to provide the desired anneal, activation, and drive-in functions.

The present invention includes numerous variations to the embodiments described above. Although a highly simplified lens error has been illustrated for convenience of explanation, it is understood that the present invention is well-suited for far more complex lens errors with irregular configurations and many degrees of image displacement. The light filter can include a light-absorbing film with several thicknesses, thereby providing several degrees of semi-transparency and transmitting several levels of light intensity. The light filter need not transmit a separate light intensity for every different measured dimension; instead, the light filer can be designed to transmit discrete light intensities that correspond to sets of closely grouped measured dimensions. Likewise, the light filter can be designed to transmit a single light intensity for several adjoining (x,y) coordinates, for instance by averaging the measured dimensional data (or light intensity data) for these coordinates. The light intensity data can be derived from a curve of light intensity versus photoresist linewidth variations. The baseline linewidth, from which the linewidth variations are measured, can be the largest measured linewidth. Alternatively, the baseline linewidth can be calculated based on the size of the test pattern and the reduction by the lens. The light filter can compensate for the lens error without reducing or eliminating all aspects of the lens error. In addition, the focused region need not encompass the center of the exposure field or have a generally circular configuration.

The light can have various wavelengths (deep ultraviolet, I-line, etc.), although a given wavelength should be used for both characterizing the lens error and subsequent projection through the light filter during the fabrication of an integrated circuit device. In addition, the light filter should be customized for a specific photolithographic system.

Providing the measured dimensional data, after patterning a first photoresist layer with a transfer pattern, may include etching a test material through the openings in the first photoresist layer using the first photoresist layer as an etch mask to remove selected portions of the test material, thereby forming test segments from unetched portions of the test material, stripping the first photoresist layer, and measuring the test segments. For instance, it might be useful to measure polysilicon segments in order to account for additional factors, such as etch bias, that could affect the dimensions of polysilicon gates. Alternatively, the measured dimensional data can be provided by projecting an image pattern, based on the test pattern, directly on an array of photosensitive detectors, without the need for patterning a photoresist layer.

The present invention is well-suited for reducing lens errors a variety of optical projection systems used for fabricating integrated circuit devices. Those skilled in the art will readily implement the steps necessary to provide the structures and methods disclosed herein, and will understand that the process parameters, materials, dimensions, and sequence of steps are given by way of example only and can be varied to achieve the desired result as well as modifications which are within the scope of the invention Variations and modifications of the embodiments disclosed herein may be made based on the description set forth herein, without departing from the spirit and scope of the invention as set forth in the following claims.

What is claimed is:

1. A photolithographic system for fabricating integrated circuit devices, comprising:
    a light source;
    a lens having a lens error defined in terms of measured dimensional data; and
    a light filter positioned between the light source and the lens, wherein the light filter is designed to vary light intensity of light projected by the light source towards the lens in accordance with the measured dimensional data and wherein the light filter is designed to decrease the light intensity as an exposure field associated with the lens becomes less focused.

2. The photolithographic system of claim 1, wherein areas of the light filter are designed to reduce the light intensity of light projected by the light source toward the lens in accordance with the measured dimensional data.

3. The photolithographic system of claim 1, wherein the light filter includes a light-absorbing film on a light-transmitting base.

4. The photolithographic system of claim 3, wherein a variation in thickness of the light-absorbing film is used to vary the light intensity.

5. The photolithographic system of claim 4, wherein the light-absorbing film is a semi-transparent layer, and the light-transmitting base is a quartz plate.

6. The photolithographic system of claim 1, wherein the light filter is designed to vary the light intensity using light intensity data derived from the measured dimensional data.

7. The photolithographic system of claim 6, wherein the light filter is designed to vary the light intensity using thickness data derived from the light intensity data.

8. The photolithographic system of claim 6, wherein the measured dimensional data and the light intensity data are a function of x and y coordinates on the exposure field associated with the lens.

9. The photolithographic system of claim 1 wherein the light filter is designed to reduce the light intensity as the radial distance from the center of the lens increases.

10. A photolithographic system for fabricating integrated circuit devices, comprising:
    a light source;
    a lens having a lens error defined in terms of measured dimensional data, wherein the measured dimensional data are used to determine a plurality of light intensity values for a plurality of x and y coordinates on a photoresist layer, the photoresist layer formed during the fabrication of an integrated circuit device; and
    a light filter positioned between the light source and the lens, wherein the light filter is designed expose a first x and y coordinate on the photoresist layer to a first light intensity value and a second x and y coordinate on the photoresist layer to a second light intensity value.

11. A photolithographic system for fabricating integrated circuit devices, comprising:
    a light source;
    a lens having a lens error defined in terms of measured dimensional data, the lens having an exposure field, the exposure field including a focused region and an unfocused region at an integrated circuit device being fabricated; and
    a light filter coupled to filter the light from the light source to cause the focused region and the unfocused region to be exposed to a different light intensity.

12. The photolithographic system of claim 11, wherein the light filter includes a light-absorbing film on a light-transmitting base.

13. The photolithographic system of claim 12, wherein a variation in thickness of the light-absorbing film is used to vary the light intensity.

14. The photolithographic system of claim 12 wherein the light-absorbing film is a semi-transparent layer, and the light-transmitting base is a quartz plate.

15. The photolithographic system of claim 11, wherein the light filter is designed to vary the light intensity using light intensity data derived from the measured dimensional data.

16. The photolithographic system of claim 15, wherein the light filter is designed to vary the light intensity using thickness data derived from the light intensity data.

17. The photolithographic system of claim 15, wherein the measured dimensional data and the light intensity data are a function of x and y coordinates on the exposure field associated with the lens.

18. The photolithographic system of claim 11 wherein the light filter is designed to reduce the light intensity as the radial distance from the center of the lens increases.

* * * * *